United States Patent [19]

Kameoka et al.

[11] Patent Number: 4,959,625
[45] Date of Patent: Sep. 25, 1990

[54] WIDE BOND BALANCED OUTPUT FREQUENCY MODULATOR USING A VIDEO SIGNAL AS A MODULATION SIGNAL

[75] Inventors: Fusahiro Kameoka, Ibaraki; Noriaki Omoto; Toshihiro Shogaki, both of Takatsuki, all of Japan

[73] Assignee: Matsushita Electric Industrial Co., Ltd., Osaka, Japan

[21] Appl. No.: 375,418

[22] Filed: Jul. 5, 1989

[30] Foreign Application Priority Data

Jul. 11, 1988 [JP] Japan .................................. 63-172121

[51] Int. Cl.$^5$ .............................................. H03C 3/20
[52] U.S. Cl. .................................... 332/135; 332/136; 331/177 V
[58] Field of Search .................. 332/135, 136; 331/23, 331/177 V

[56] References Cited

U.S. PATENT DOCUMENTS 4,602,224 7/1986 Arimoto et al. ..................... 332/135

FOREIGN PATENT DOCUMENTS 0445115 11/1974 U.S.S.R. ............................. 332/135

OTHER PUBLICATIONS

Hasegawa et al.: "Fully Intergated FM Demodulator Circuits for Satellite TV Receivers", IEEE Transaction on Consumer Electronic, vol. CE-33, No. 2, May 1987.

Primary Examiner—Robert J. Pascal
Attorney, Agent, or Firm—Stevens, Davis, Miller & Mosher

[57] ABSTRACT

A frequency modulator is provided, in which, for instance, a video signal is used as a modulation signal. A differential amplifier is formed by first and second transistors. First and second load resistors are connected between respective collectors of the first and second transistors and a power supply terminal (A). A series circuit of first and second feedback capacitors is inserted between the collector of the first transistor and a base of the second transistor. A series circuit of third and fourth feedback capacitors is inserted between the collector of the second transistor and a base of the first transistor. The respective same electrodes of first and second variable capacitance diodes are connected with each other and the other electrodes thereof are connected respectively to a junction point of the first and second feedback capacitors and to a junction point of the third and fourth feedback capacitors. First and second resonance coils are connected between the respective other electrodes of the first and second variable capacitance diodes and a reference potential point. A modulation signal is applied to the same electrode junction of the first and second variable capacitance diodes, and oscillation output signals of opposite phases are obtained from the respective collectors of the first and second transistors.

2 Claims, 3 Drawing Sheets

WIDE BOND BALANCED OUTPUT FREQUENCY MODULATOR USING A VIDEO SIGNAL AS A MODULATION SIGNAL

BACKGROUND OF THE INVENTION

The present invention relates to a frequency modulator constructing a wide band frequency demodulator such that a video signal is used as a modulation signal.

In a recent frequency demodulator which deals with a video signal, a system using a PLL (phase locked loop) comprising a phase comparator, a frequency modulator, and a loop amplifier is mainly used. The production of an IC for demodulators according to this system is currently conducted. In making the IC, it is a general practice that these circuits are constructed in a differential type thereby to perform signal processing such as amplification and the like.

The conventional frequency modulator will be described hereinbelow with reference to the drawings.

FIG. 1 shows a circuit of a conventional frequency modulator.

In FIG. 1, reference numeral 231 denotes a transistor; 232 indicates a transistor; 233 a constant current source; 234 and 235 resistors; 236 and 237 capacitors; 238 and 239 variable capacitance diodes; 240 a resonance coil; 241 and 242 base bias resistors; and 243 a power source. The transistors 231 and 232 are connected in a differential manner. The resistor 234 is connected between a collector of the transistor 231 and a voltage supply terminal C. The resistor 235 is connected between a collector of the transistor 232 and the voltage supply terminal C. The common emitters of the transistors 231 and 232 are connected to the constant current source 233. On the other hand, the capacitors 236 and 237 are connected in series and this series connection is inserted between the collector of the transistor 232 and a base of the transistor 231. A junction point of the capacitors 236 and 237 is connected to the ground through a tank circuit comprising the resonance coil 240 and the variable capacitance diodes 238 and 239 which are connected in series at their cathode sides. A control voltage terminal D is connected between cathodes of the diodes 238 and 239. The resistors 242 and 241 are connected in series between the bases of the transistors 232 and 231 in the order of the resistors 242 and 241. The power source 243 is applied to a node of the resistors 242 and 241.

The operation of the frequency modulator constructed as mentioned above will now be described hereinbelow.

First, a base bias of the differential amplifier composed of the transistors 231 and 232 is supplied by the power source 243 through the resistor 241 or 242. Each collector of the transistors 231 and 232 is connected to the voltage supply terminal C through the resistor 234 or 235. Each of the collector currents flowing through the transistors 231 and 232 is given by the constant current source 233, and a feedback loop is formed by the capacitor 236. A modulation signal is applied as a control voltage to the cathodes of the diodes 238 and 239 from the control voltage terminal D. Capacitances of the variable capacitance diodes 238 and 239 are determined by the control voltage given. A parallel resonance circuit, which is formed by the resonance coil 240 and the variable capacitance diodes 238 and 249, is connected to the base of the transistor 231 through the capacitor 237 and it resonates. An oscillating frequency is determined by a resonance frequency of the parallel resonance circuit and is outputted from each of the collectors of the transistors 231 and 232. E and F denote output terminals of the transistors 231 and 232.

However, in the above construction, the oscillating signal is applied to the base of one of the transistors, the base of the other transistor is connected to the ground, and the differential amplifier is used in the unbalanced state. Therefore, there is a problem such that a difference occurs between the oscillating outputs from the collectors of the first and second transistors.

SUMMARY OF THE INVENTION

It is an object of the present invention to provide a wide band frequency modulator in which a balanced output having no difference between the oscillation outputs of the first and second transistors is produced and a video signal is used as a modulation signal.

To accomplish the above object, a frequency modulator according to the present invention is constructed in a manner such that first and second transistors are connected in a differential manner, first and second loads are respectively connected between respective collectors of the first and second transistors and a voltage supply terminal, the collector of the first transistor is connected to a base of the second transistor through a first feedback capacitor and a second feedback capacitor connected in series with the first feedback capacitor, the collector of the second transistor is connected to a base of the first transistor through a third feedback capacitor and a fourth feedback capcitor connected in series with the third feedback capacitor, an anode or a cathode of a first variable capacitance diode is connected to a junction point between the first and second feedback capacitors, and a cathode or an anode of the second variable capacitance diode is connected to the cathode or anode of the first variable capacitance diode. The anode or cathode of the second variable capacitance diode is connected to a junction point between the third and fourth feedback capacitors, a junction point between the junction point of the third and fourth feedback capacitors and the anode or cathode of the second variable capacitance diode is connected to the ground through a first resonance coil, a junction point between the junction point of the first and second feedback capacitors and the anode or cathode of the first variable capacitance diode is connected to the ground through a second resonance coil, and a modulation signal is applied to the junction point of the cathodes or anodes of the first and second variable capacitance diodes.

The operation of the frequency modulator of this invention is described hereunder.

With the above-described construction of the frequency modulator of this invention, the potentials of the collectors of the first and second transistors are set to the same potential, and a positive feedback loop is formed by the first and second feedback capacitors connecting the base of the second transistor and the collector of the first transistor and the third and fourth feedback capacitors connecting the base of the first transistor and the collector of the second transistor.

Output signals of the same amplitude are outputted to the first and second bases and are positively fed back to the collectors of the first and second transistors, so that the oscillation can take place. The second and fourth feedback capacitors function to suppress the occurrence of multivibrator type oscillation in the differential amplifier with an oscillation time constant determined by respective combination of the second and first base bias resistors with the first and third feedback capacitors. The resonance circuit is disposed between the junction point of the first and second feedback capacitors and the junction point of the third and fourth feedback capacitors.

The oscillating frequency of the modulator is determined by the variable capacitance diodes and the resonance coils. The oscillation voltage produced by the resonance circuit is inputted to the bases of the first and second transistors. At the frequency of the modulation signal which is applied to the variable capacitance diodes, the impedance of the resonance coils can be regarded to be sufficiently lower than the impednace of the variable capacitance diodes. Therefore, the frequency modulator can be driven at a low impedance, and hence all the modulation signal is applied as a control voltage across the variable capacitance diodes. Thus, with the modulator having the above-described construction, it becomes possible to perform frequency modulation by using a wide band signal such as a video signal.

DESCRIPTION OF THE PREFERRED EMBODIMENTS

A frequency modulator of an embodiment of the present invention will be described hereinbelow with reference to the drawings.

Figure 1:
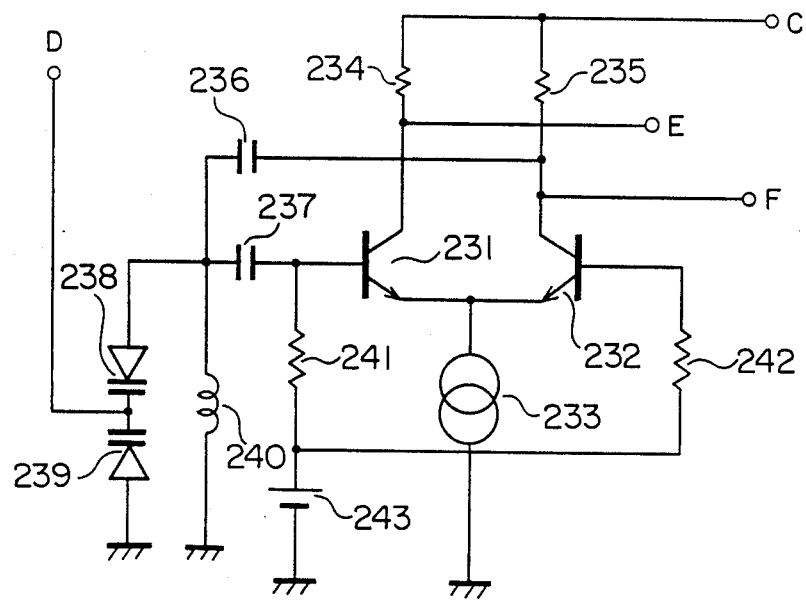
FIG. 1 is a circuit diagram showing a construction of a conventional frequency modulator.
Figure 2:
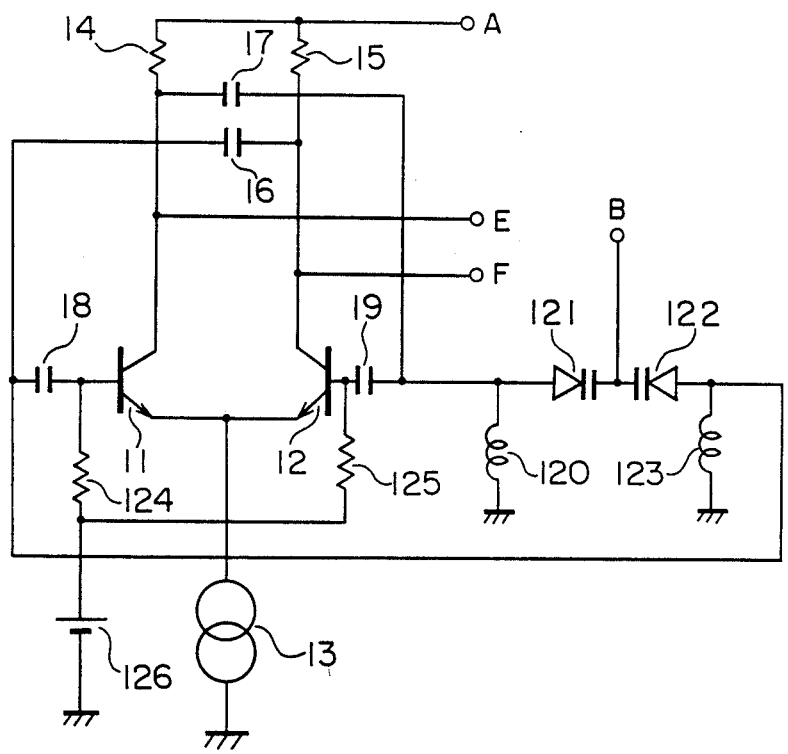
FIG. 2 is a circuit diagram showing a construction of a frequency modulator according to the first embodiment of the present invention.
Figure 3:
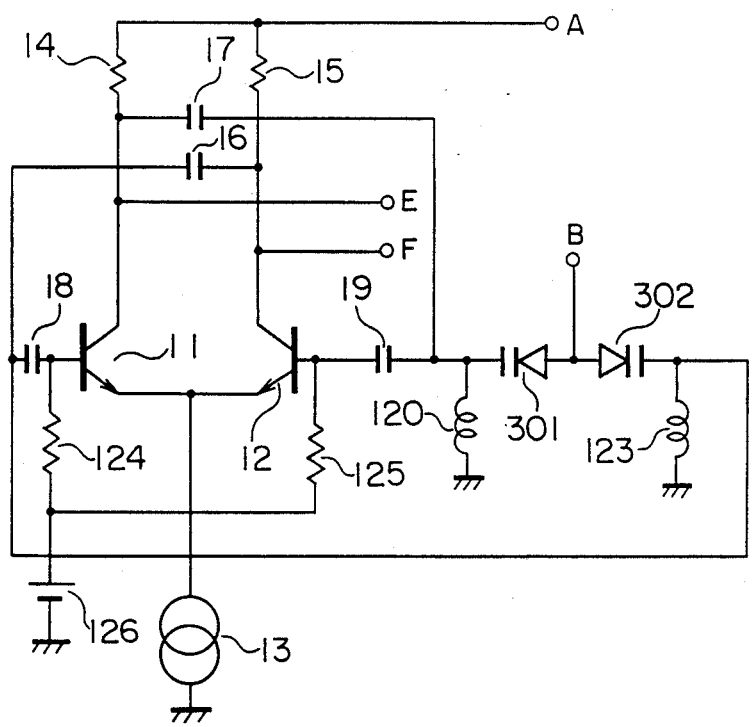
FIG. 3 is a circuit diagram showing a construction of a frequency modulator according to the second embodiment of the present invention.

FIGS. 2 and 3 show circuits of frequency modulators in the embodiments of the invention.

In FIG. 2, reference numeral 11 denotes a transistor; 12 a transistor; 13 a constant current source; 14 a load resistor; 15 a load resistor; 16 a feedback capacitor; 17 a feedback capacitor; 18 a feedback capacitor; 19 a feedback capacitor; 120 a resonance coil; 121 a variable capacitance diode; 122 a variable capacitance diode; 123 a resonance coil; 124 and 125 base bias resistors; and 126 a power source. In FIG. 3, reference numerals 301 and 302 denote variable capacitance diodes. In FIG. 3, the other components are the same as those in FIG. 2.

The transistors 11 and 12 are connected in a differential manner. The emitters of the transistors 11 and 12 are connected in common with each other. The constant current source 13 is connected between the common emitter and a reference potential point. The resistor 14 is connected between a collector of the transistor 11 and a power supply terminal A. The resistor 15 is connected between a collector of the transistor 12 and the power supply terminal A. The feedback capacitors 17 and 19 are connected in series and inserted between the collector of the transistor 11 and a base of the transistor 12. The feedback capacitors 16 and 18 are connected in series and inserted between the collector of the transistor 12 and a base of the transistor 11. One end of the resonance coil 120 and an anode of the variable capacitance diode 121 are connected to a junction point of the feedback capacitors 17 and 19. The other end of the resonance coil 120 is connected to a ground potential point. On the other hand, one end of the resonance coil 123 and an anode of the variable capacitance diode 122 are connected to a junction point of the feedback capacitors 16 and 18. Cathodes of the variable capacitance diodes 121 and 122 are connected with each other and a modulation signal is applied as a control voltage from a terminal B to a junction point of the cathodes of the variable capacitance diodes 121 and 122. One end of the base bias resistor 124 is connected to the base of the transistor 11. One end of the base bias resistor 125 is connected to the base of the transistor 12. The other ends of the resistors 124 and 125 are connected commonly to the power source 126.

The operation of the frequency modulator constructed as mentioned above will now be described hereinbelow with reference to FIG. 2.

First, a base bias of the differential amplifier is supplied from the power source 126 through the resistor 124 or 125. A constant current, which flows through the collector-emitter circuits of both transistors 11 and 12, is given by the constant current source 13 and a feedback loop is formed by the feedback capacitors 16 to 19.

The modulation signal is applied as a control voltage from the terminal B to the cathodes of the diodes 121 and 122. Capacitances of the variable capacitance diodes 121 and 122 are determined by the control voltage. Resonance circuits formed by respective combinations of the resonance coils 120 and 123 with the variable capacitance diodes 121 and 122, which are connected in series between the junction point of the feedback capacitors 16 and 18 and the junction point of the feedback capacitors 17 and 19, resonate. An oscillating frequency is thereby decided and a balanced output is generated. The load resistors 14 and 15, the feedback capacitors 16 and 17, and the feedback capacitors 18 and 19 are selected to have the same values, respectively.

The feedback capacitors 18 and 19 are used to weaken the coupling between the resonance circuit and the differential amplifier and they function also as elements for determining the linearity in the relation of the oscillating frequency versus the control voltage. In a wide band modulator which deals with a video signal, the linearity exerts a large influence on the carrier chrominance signal differential gain and the differential phase of the video signal. The capacitances of the feedback capacitors 18 and 19 are selected to have a value of 5 pF to assure good linearity. On the other hand, two variable capacitance diodes 121 and 122 are used to suppress high frequency distortion.

As described above, according to the embodiment, the oscillating voltages generated by the resonance circuits are applied to the bases of the transistors 11 and 12 which are connected in a differential manner. The feedback loop is formed by the feedback capacitors 16 and 17 having the same capacitance value and the feedback capacitors 18 and 19 having the same capacitance value. Balanced modulated output signals, whose phases are opposite to each other, are generated at the respective collectors of the transistors 11 and 12. Since the impedance of the resonance coils 120 and 123 is sufficiently lower than the impedances of the variable capacitance diodes 121 and 122, the frequency modulator is driven at a low impedance, and all the modulation signal can be applied as a control voltage across the variable capacitance diodes. An example of the values of the respective component elements is shown hereinbelow.

Example of Values of Component Elements

| Example of Values of Component Elements | |
|---|---|
| Load resistors 14, 15 | 200 Ω |
| Feedback capacitors 16, 17 | 5 pF, |
| Feedback capacitors 18, 19 | 5 pF, |
| Base bias resistors 124, 125 | 5 kΩ, |
| Constant current source 13 | 4 mA |
| Variable capacitance diode 121 — MM 334B | Products of MATSUSHITA ELECTRONICS COMPONENTS CO., LTD. |
| Variable capacitance diode 122 — MM 338 | |
| Resonance coils 120, 123 | 18 nH |
| Transistors 11, 12 | Integrated circuited |
| Power supply terminal A | DC 5V |
| Power source 126 | DC 3V |

In the embodiment of the present invention shown in FIG. 2, in the resonance circuit, the variable capacitance diodes 121 and 122 have been connected with each other at their cathodes. However, as shown in FIG. 3, it is also possible to construct a resonance circuit in a manner such that the respective anodes of the variable capacitance diodes 301 and 302 are connected with each other, a junction point between the junction point of the feedback capacitors 17 and 19 and a cathode of the variable capacitance diode 301 is connected to the ground through the resonance coil 120 and it is simultaneously connected to the base of the transistor 12 through the feedback capacitor 19, and a junction point between the junction point of the feedback capacitors 16 and 18 and a cathode of the variable capacitance diode 302 is connected to the ground through the resonance coil 123 and it is simultaneously connected to the base of the transistor 11 through the feedback capacitor 18.

As described above, according to the present invention, the first and second transistors are connected in a differential manner and the oscillating signals are applied to the bases of the first and second transistors, so that the frequency modulator generates a balanced output. On the other hand, since the impedances of the resonance coils can be regarded to be sufficiently lower than the impedances of the variable capacitance diodes, the frequency modulator can be driven at a low impedance and all the modulation signal is applied as a control voltage across the variable capacitance diodes. Therefore, frequency modulation can be performed by using a wide band signal such as a video signal, whereby an excellent practical effect is obtained.

What is claimed is:

1. A frequency modulator comprising:
   first and second transistors composing a differential amplifier;
   first and second load resistors inserted between respective collectors of said first and second transistors and a power supply terminal (A);
   a series circuit of first and second feedback capacitors inserted between the collector of said first transistor and a base of said second transistor;
   a series circuit of third and fourth feedback capacitors inserted between the collector of said second transistor and a base of said first transistor;
   first and second variable capacitance diodes in which respective cathodes thereof are connected with each other and an anode of said first variable capacitance diode is connected to a junction point of said first and second feedback capacitors and an anode of said second variable capacitance diode is connected to a junction point of said third and fourth feedback capacitors;
   a first resonance coil having one end thereof connected to the anode of said first variable capacitance diode and the other end thereof connected to a reference potential point; and
   a second resonance coil having one end thereof connected to the anode of said second variable capacitance diode and the other end thereof connected to the reference potential point,
   wherein a modulation signal is applied to the common cathode junction of said first and second variable capacitance diodes, and oscillation output signals are obtained from the respective collectors of said first and second transistors.

2. A frequency modulator comprising:
   first and second transistors composing a differential amplifier;
   first and second load resistors inserted between respective collectors of said first and second transistors and a power supply terminal (A);
   a series circuit of first and second feedback capacitors inserted between the collector of said first transistor and a base of said second transistor;
   a series circuit of third and fourth feedback capacitors inserted between the collector of said second transistor and a base of said first transistor;
   first and second variable capacitance diodes in which respective anodes thereof are connected with each other and a cathode of said first variable capacitance diode is connected to a junction point of said first and second feedback capacitors and a cathode of said second variable capacitance diode is connected to a junction point of said third and fourth feedback capacitors;
   a first resonance coil having one end thereof connected to the cathode of said first variable capacitance diode and the other end thereof connected to a reference potential point; and
   a second resonance coil having one end thereof connected to the cathode of said second variable capacitance diode and the other end thereof connected to the reference potential point,
   wherein a modulation signal is applied to the common anode junction of said first and second variable capacitance diodes, and oscillation output signals are obtained from the respective collectors of said first and second transistors.

* * * * *